United States Patent [19]
Fechner et al.

[11] Patent Number: 5,631,863
[45] Date of Patent: May 20, 1997

[54] RANDOM ACCESS MEMORY CELL RESISTANT TO RADIATION INDUCED UPSETS

[75] Inventors: Paul S. Fechner, Plymouth; Gregor D. Dougal; Keith W. Golke, both of Minneapolis, all of Minn.

[73] Assignee: Honeywell Inc., Minneapolis, Minn.

[21] Appl. No.: 587,065

[22] Filed: Jan. 16, 1996

Related U.S. Application Data

[63] Continuation of Ser. No. 388,098, Feb. 14, 1995, abandoned.

[51] Int. Cl.$^6$ .................................................. G11C 11/412
[52] U.S. Cl. ......................... 365/156; 365/154; 365/190; 257/903; 257/904
[58] Field of Search ...................... 365/156, 154, 365/148, 190; 257/393, 903, 904

[56] References Cited

U.S. PATENT DOCUMENTS

| | | | |
|---|---|---|---|
| 4,725,981 | 2/1988 | Rutledge | 365/154 |
| 4,797,804 | 1/1989 | Rockett, Jr. | 365/154 |
| 4,956,814 | 9/1990 | Houston | 365/154 |
| 5,301,146 | 4/1994 | Hama | 365/154 |

*Primary Examiner*—David C. Nelms
*Assistant Examiner*—Andrew Q. Tran
*Attorney, Agent, or Firm*—Gregory A. Bruns

[57] ABSTRACT

A radiation resistant random access memory cell which has a coupling circuit between a storage node of a first CMOS pair and a gate node of a second CMOS pair. The coupling circuit is controlled by a word line and provides a first resistive element between the storage node and the body of the coupling circuit and a second resistive element between the gate node and the body of the coupling circuit.

9 Claims, 3 Drawing Sheets

RANDOM ACCESS MEMORY CELL RESISTANT TO RADIATION INDUCED UPSETS

This application is a continuation of application Ser. No. 08/388,098, filed Feb. 14, 1995, now abandoned.

BACKGROUND OF THE INVENTION

The present invention is directed toward Random Access Memories (RAMs) and particularly toward static RAMs for use in radiation environments. There has always been a direct relationship between the radiation induced upset rate requirements and the performance requirement of radiation hardened static Random Access Memories. In the past, to achieve a low radiation induced upset rate, the performance of the RAM had to be compromised.

The military and space markets have created a need for electronic systems which can operate in high radiation environments. Most applications for these systems also require high performance, high complexity, and very low power, e.g., satellite applications. Moreover, these systems generally are memory intensive, thereby creating a growing radiation hardened, CMOS memory market. Therefore, there is a need to develop new technologies that are radiation hardened, i.e., have a tolerance or immunity to radiation effects. Other equivalent phrases include radiation hard or rad hard.

Radiation can interact with silicon based material and can cause many undesirable effects in circuit operation. For example, radiation can change the conductance of MOS transistors by changing the threshold voltage (Vt). Many of these undesirable effects can be minimized by using a radiation hardened process technology. However, in Very Large Scale Integration (VLSI) circuits, radiation can also generate significant levels of transient voltage and current disturbances on internal nodes, including power and ground. These internal disturbances can slow circuit performance or even upset circuit operation, e.g. changing the state of a memory cell. Simply having a radiation hardened process is not adequate to suppress these effects. There are specific design techniques which must be considered to adequately harden VLSI circuits.

In order to analyze radiation effects on circuits, it is common practice to categorize the radiation environment into the following four categories: (1) total dose, (2) dose rate, (3) Single Event Upset (SEU), and (4) neutron effects. The present invention is directed toward decreasing the SEU rate.

Single Event Upset Environment

The worst case single event upset (SEU) environment is encountered in space. SEU is caused by energetic particles traversing circuit nodes and depositing charge sufficient to disrupt operation. The particle distribution of concern is random, homogeneous in three dimensional space and has a small flux. Therefore, the act of actually striking any particular circuit node is defined as a probability per unit time and defines a single event upset rate. A single event upset is an introduced error that can be corrected and is therefore generally called a soft error. The rate at which the soft errors accumulate is called the soft error rate (SER) and is equivalent to the single event upset rate. If the circuit of interest has more than one sensitive node, the SER for each node is summed to define a total SER for the circuit.

Single Event Upset Electrical Effects

For a given node within a memory cell, there exists an amount of deposited charge which the driving transistor and the nodal capacitance cannot absorb and still hold the node in the desired state. Therefore, the radiation induced charge can result in a change in the stored data state. The charge threshold at which this occurs is called the critical charge of the memory cell.

In interplanetary space, heavy particles are considered the dominating cause for data upsets. Heavy particles are capable of depositing relatively large amounts of deposited charge on a circuit node. There has always been a direct relationship between the radiation induced upset rate requirements and the performance requirement of radiation hardened static Random Access Memories (RAMs). To achieve a low radiation induced upset rate, the performance of the RAM had to be compromised.

The memory cell is the data storage element in a random access memory (RAM) circuit. It stores the data in binary format with a corresponding high and low voltage. The stored data can be retrieved from the memory cell in what is called a read operation, or access. Data can be imposed upon the memory for storage in what is called a write operation. The memory must maintain the integrity of the data during a read and yet it must allow its state to be altered when deliberately written.

The static memory cell consists of a bi-stable element made up of two cross coupled inverters that have controllable access ports. The data state is determined by the state of the bi-stable element. To perform a read of the stored data state the pass gates are turned on (via the word line) and the state of the bi-stable element is imposed on the bitlines. The stored data state is maintained and only the pass gates need to be turned off before the next access begins. When the data is not being accessed, the device drive on both nodes of the bi-stable element actively maintains the high and low voltage conditions. Thus leakage current can be tolerated without loss of the data state and no data refresh is needed. The distinct advantage of the static cell over the dynamic cell is its ability to maintain the data state indefinitely without any intervention (such as refresh which is required in a dynamic RAM). Therefore, it can be accessed at any time without any down time due to refresh.

There are different types of MOS memory cells: NMOS, CMOS, static and dynamic with variations within each of these categories. Memory cell may be configured as 4 transistor (4T) or six transistor (6T) cells. The six transistor (6T) cell creates the inverter with a p-channel pull-up and a n-channel pull-down as shown in FIG. 2. The advantage of the 6T cell is that the pull-up transistors have significantly greater pull-up current drive than the resistors in the 4T cell and therefore greatly reduces the susceptibility to an radiation induced upset. It is this last feature that makes the 6T cell superior in radiation environments.

Six Transistor Memory Cell and SER

The six-transistor memory cell relies on the n-channel transistor to maintain a low data state and the p-channel transistor to maintain a high data state. The transistors are generally minimum size in order to minimize the memory cell area. In order to evaluate the SER of the memory cell it is necessary to consider the maximum current capability of the transistors. When a heavy ion traverses a node within the memory cell it may force the node from its original state to the opposite state for some period of time. This is due to the charge that the heavy ion deposits as it passes through the silicon. If this node is held in the opposite state for a period longer than the delay around the memory cell feedback loop, the cell will switch states and the data will be lost. The period of time which the node will be held in its opposite state depends on three factors: (1) the charge deposited, (2) the conductance of the memory cell transistors, and (3) the delay around the feedback loop of the memory cell. One way to prevent the upset is to increase the conductance of the transistors (and therefore increase the size of the transistors). However, this would increase the size of the memory cell by >10x which would not be practical in today's market. A more economical solution is to increase the feedback delay. This gives the "on" transistor time to remove the deposited charge before the voltage state change can propagate sufficiently to establish the regenerative feedback which would result in an upset. The feedback delay can be increased by adding resistors to the 6T cell (see FIG. 1). These resistors are commonly called cross coupled resistors.

The cross coupled resistors have proven effective in increasing the critical charge of a memory cell. However, since they are designed to increase the delay in the feedback loop to prevent a memory cell upset due to a heavy particle hit, they also resist a deliberate write and therefore increase the write time of the memory cell. For a typical SEU requirement the write time can increase more than 5x over the write time of the cell without the cross coupled resistors.

The cross coupled resistors are often made using polysilicon with sheet resistance of about 100k-ohm/square. In this region of sheet resistance the temperature coefficient is negative and large. In a typical design this temperature coefficient can cause write times to vary radically with temperature. In the past, the increase has been an acceptable penalty for the SEU hardness primarily because systems to date have been able to define a temperature environment of 0–80 degrees C. However, as system memory sizes increase, lower SER's will become necessary and the increased write times will become intolerable.

An alternative to cross-coupled resistors is miller-coupled capacitors (see FIG. 2). Note that the capacitors in FIG. 2 are connected between the input and output of the memory cell inverters. This was deliberately done to take advantage of the miller effect (the raw capacitance value is multiplied by the gain of the inverter to get the effective capacitance).

Miller-coupled capacitors do not have significant temperature coefficients and therefore the write times do not significantly vary with temperature. In addition, the purpose of the miller-coupled capacitors is the same as the cross-coupled resistors; to add delay to the feedback path in order to provide time for the memory cell transistors to remove the deposited charge and therefore significantly improve SEU. However, unlike the cross-coupled resistor cell, the delay added to the feedback path does not directly translate into an increase in write time. This follows because the capacitance that must be discharged by the bit lines during a write operation is only the raw capacitance and not the miller "effective" capacitance. Therefore, the miller-coupled capacitor memory cell configuration performs better than the cross-coupled resistor configuration.

A disadvantage with the miller-coupled capacitor approach is the area required to create the necessary capacitance. Even when taking advantage of the miller effect, the capacitors can become excessively large to be used in large RAM memories. The cross-coupled resistor cell can be much smaller than the miller-coupled capacitor cell.

Memory Cell with Cross Coupled Transistors

This memory cell, herein referred to as the "cross-coupled transistor cell", is similar to the cross-coupled resistor cell previously discussed, except that the cross-coupled resistors are replaced with cross-coupled n-channel transistors. These cross coupled transistors are connected as follows: (1) the source is connected to the output of one memory cell inverter, (2) the drain is connected to the input of the other memory cell inverter, and (3) the gate is connected to the word line (see FIG. 3).

The operation of the cell is much the same as that of a standard static 6T memory cell with the following exception. When the word line is high, i.e., the cell is selected, the resistance of the cross-coupled transistor is very low, because the transistors are "on", and therefore the cell can be written very quickly. When the word line is low, the resistance of the cross-coupled transistors is very high, because the transistors are "off", and therefore the cell is very SEU hard to heavy ion hits.

The cross-coupled transistors must be sufficiently "leaky" when they are turned "off" to ensure that the memory cell remains in the desired state without requiring refresh, as with dynamic RAM's. This is accomplished by introducing a resistive element in parallel with the cross-coupled transistor. The resistive element must be large enough to insure that the SEU requirement for the RAM is met. Note that when the cell is being written to, the resistive element is shorted out by the cross-coupled transistor.

A remaining problem with the cross-coupled transistor configuration of FIG. 3 relates to the fact that a three terminal transistor on a bulk substrate would normally have its body terminal connected to the Vss potential for n-channel or the Vdd potential for p-channel. The inability to completely isolate the body terminal of the three terminal transistor from the power supply potentials increases the SEU sensitive area, i.e., cross section by the area of nodes A and A' in FIG. 3. In order to attempt to improve SEU immunity, the impedance level in parallel with the cross coupled transistors must be at least 10–100X higher than the inverter output nodes. Because A and A' are high impedance nodes, these will be easily discharged and held at ground (if cross-coupled transistors are n-channel) or Vdd (if cross-coupled transistors are p-channel) when a SEU event strikes the body or junction. This state change on the input to the inventor propagates through to its output node. At this point, both A and A' in FIG. 3 are at the same state and the output of the invertors are at the same state but the opposite of A and A'.

Once this symmetric condition is reached the cell state becomes indeterminate causing a cell state upset. This creates a situation where employing the cell, as described, on a bulk technology is likely to be more SEU sensitive with the cross coupled transistors than without them. In summary, the cross-coupled transistor solution just described may in fact be more SEU prone than the standard 6T cell making it of no practical value.

Another prior art approach has been to use a gated resistor in an additional layer of polysilicon to fully isolate the node of interest from SEU effects. The gated resistor does not require a body contact since it is only of one dopant type (n). However, this approach requires at least one additional polysilicon deposition, photocut as well as doping and oxidation steps in order to form the gated resistor element. Control of these processes to produce a consistent device characteristic is not trivial and requires significant development and characterization effort.

Thus a need exists for a memory cell that achieves a much lower radiation induced upset rate than in the past without compromising the memory cell performance.

SUMMARY OF THE INVENTION

The present invention solves these and other needs by providing a RAM cell described as follows:

- a first P-channel FET device connected between a first storage node and relatively positive voltage and a first N channel FET device connected between the first storage node and a relatively negative potential, with the gates of the first P channel and the first N channel devices connected in common to a first gate node and with the first storage node selectively connected to a first output line by a word line signal;

- a second P-channel FET device connected between a second storage node and a relatively positive voltage and a second N channel FET device connected between the second storage node and a relatively negative potential, with the gates of the second P channel and the second N channel devices connected in common to a second gate node and with the second storage node selectively connected to a second output line by the word line signal;

- a first coupling means having a first terminal connected to the word line second terminal connected to the first storage node, a third terminal connected to the second gate node, and a first body isolated from the first and second P channel devices with a first resistive means connected between the first coupling means second terminal and the first body, and a second resistive means connected between the first coupling means third terminal and the first body; and

- a second coupling means having a first terminal connected to the word line, a second terminal connected to the second storage node, a third terminal connected to the first gate node, and a second body isolated from the first and second P channel devices, with a third resistive means connected between the second coupling means second terminal and the second body, and a fourth resistive means connected between the second coupling means third terminal and the second body.

In a second aspect the first and second resistive means are provided by TiSi2 Schottky devices.

In a third aspect, only a single resistive means is required.

DETAILED DESCRIPTION OF THE INVENTION

Figure 1:
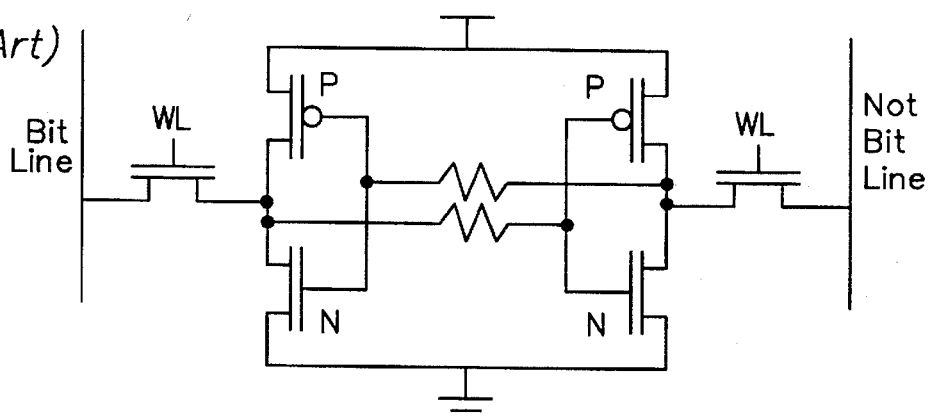
FIG. 1 is a schematic for a memory cell using cross coupled resistors as found in the prior art.
Figure 2:
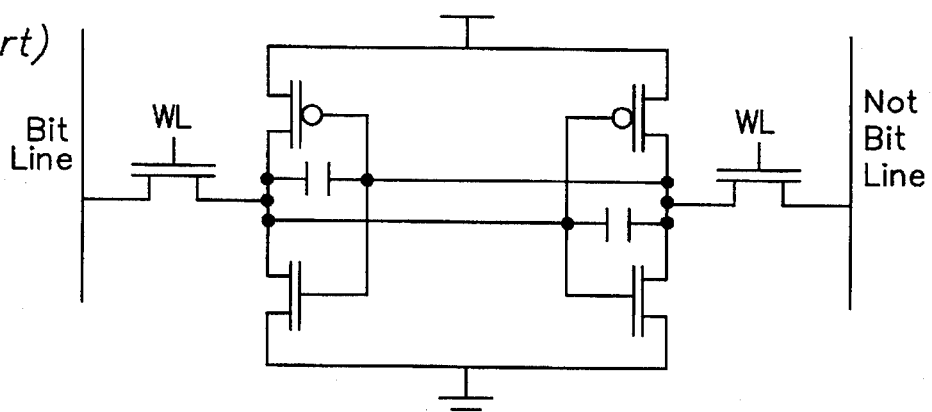
FIG. 2 is a schematic for a memory cell using Miller capacitors as found in the prior art.
Figure 3:
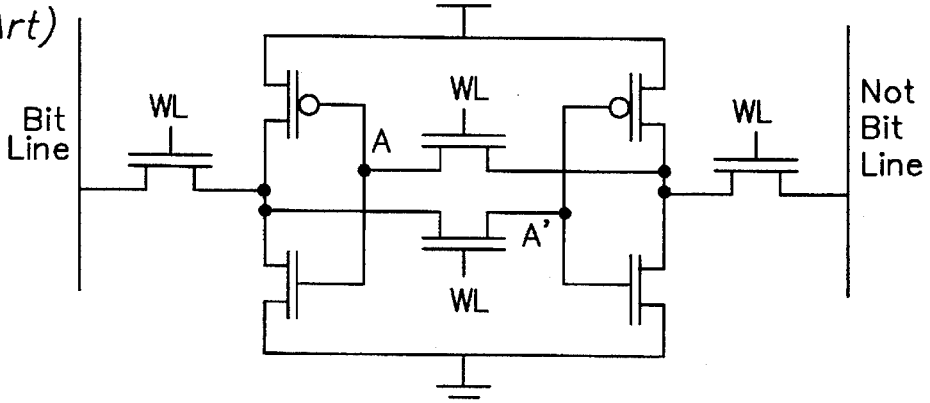
FIG. 3 is a schematic for a memory cell using cross coupled transistors as found in the prior art.

A CMOS memory cell according to the teachings of the present invention is shown in the drawings and generally designated 10. All transistors are FETs. Cross coupled N channel transistors 12 and 14 have their sources connected to a relatively negative voltage, typically ground. Transistor 12 has its drain connected to node 16 and transistor 14 has its drain connected to node 18. P channel load transistors 20 and 22 have their sources connected to voltage terminal 24, typically VDD. Transistor 20 has its drain connected to node 16 and transistor 22 has its drain connected to node 18. Transistor 12 and transistor 20 have their gates connected in common at node 17. Transistor 14 and transistor 22 have their gates connected in common at node 19. N channel pass gate 26 has its source connected to Bit line 28, its gate connected to word line 30 and its drain connected to node 16. N channel pass gate 32 has its source connected to not Bit line 34, its gate connected to word line 30, and its drain connected to node 18. Memory cell 10 includes N-channel cross coupled transistor 40, having source 46 connected to node 16, drain 48 connected to node 19 and gate 44 connected to word line 30. Memory cell 10 also includes transistor 42 having source 41 connected to node 18, drain 43 connected to node 17 and gate 45 connected to word line 30.

The body of the n-channel cross coupling transistors 40 and 42 must be at the same potential as the source and drain terminals when the word line is turned off, i.e., in the SEU immune mode. This requires that it be isolated relative to the normal well potentials experienced by the other transistors in the circuit. One way of accomplishing this is by using SOI starting substrates for circuit fabrication. However, total isolation of this terminal is not desirable as it can lead to circuit instability due to this node totally floating. In addition, when the source side of the transistor 40 or 42 is pulled low due to an SEU hit on node 16 or node 18 respectively, bipolar gain effects can multiply the body current pulled through the source junction. This junction acts as the emitter base function of a lateral bipolar transistor multiplying the charge extracted by the gain (beta) of the lateral bipolar. To first order the amount of charge removed from the transistor gate connected to the drain of transistor 40 would be the word line gate to body capacitance charge multiplied by the bipolar transistor beta which can be greater or equal to the charge on the gates of the transistors connected to the coupling transistor drain (collector) node.

Figure 5:
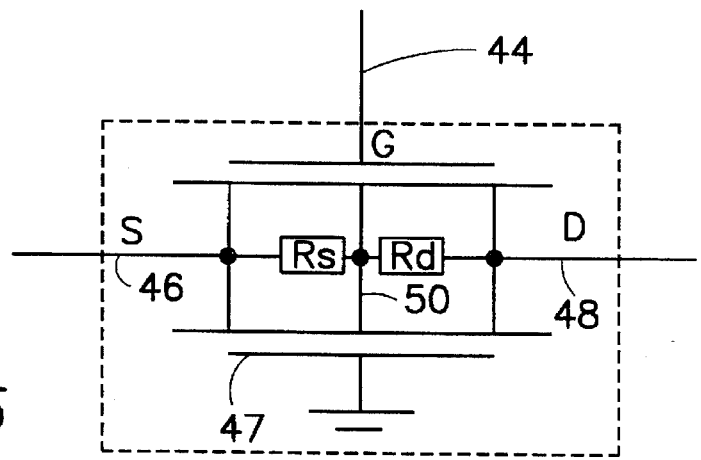
FIG. 5 is an expanded drawing of a portion of FIG. 4 to show additional details.

In order to eliminate this instability, and using transistor 40 as an example, a resistive contact $R_s$ is required between the body 50 and the source 46, and a resistive contact $R_d$ is required between body 50 and drain 48 as shown in FIG. 5. Also shown in FIG. 5 are top gate 44 of N-channel transistor 40, and grounded backside gate (buried oxide) 47. The resistive contact must perform the following functions:

a) Provide a low enough resistance to prevent the body tie to source voltage from reaching a potential high enough to turn on the lateral bipolar. That is, resistive contact $R_s$ must have a resistance sufficiently low enough to maintain a voltage between source 46 and body 50 below a voltage that would initiate a bipolar transistor action.

b) Provide a high enough resistance to prevent discharge of the gates connected to the drain terminal during an SEU event thus preventing upset. That is, resistive contact $R_d$ must have a resistance sufficiently high enough to prevent discharge of node 19. For example, if node 16 is in a high state, an SEU event which occurs in transistor 12 will cause node 16 to discharge to ground. If node 19 remains high, then p-channel transistor 20 will eventually recharge node 16 to high and the cell will again be in a stable condition. During this recharge time, the resistance $R_d$ between node 16 and node 19 must be sufficient to prevent discharge of node 19.

c) Provide a low enough resistance to allow the cell gate terminal to fully charge up to that of the inverter output node (Vdd) in a time that reduces crowbar current from flowing through the inverter to an acceptable level during power up, an SEU event and cell read/write cycles.

d) For total dose radiation environments the resistive element described in (a) through (c) must be immune to total dose radiation. Therefore, any parasitic leakage paths which are caused by total dose radiation must be kept low relative to nominal $R_d$ and $R_s$ values.

The function of resistive contacts $R_s$ and $R_d$ have only been described relative to coupling transistor 40 but similar resistive contacts are required for transistor 42.

Figure 4:
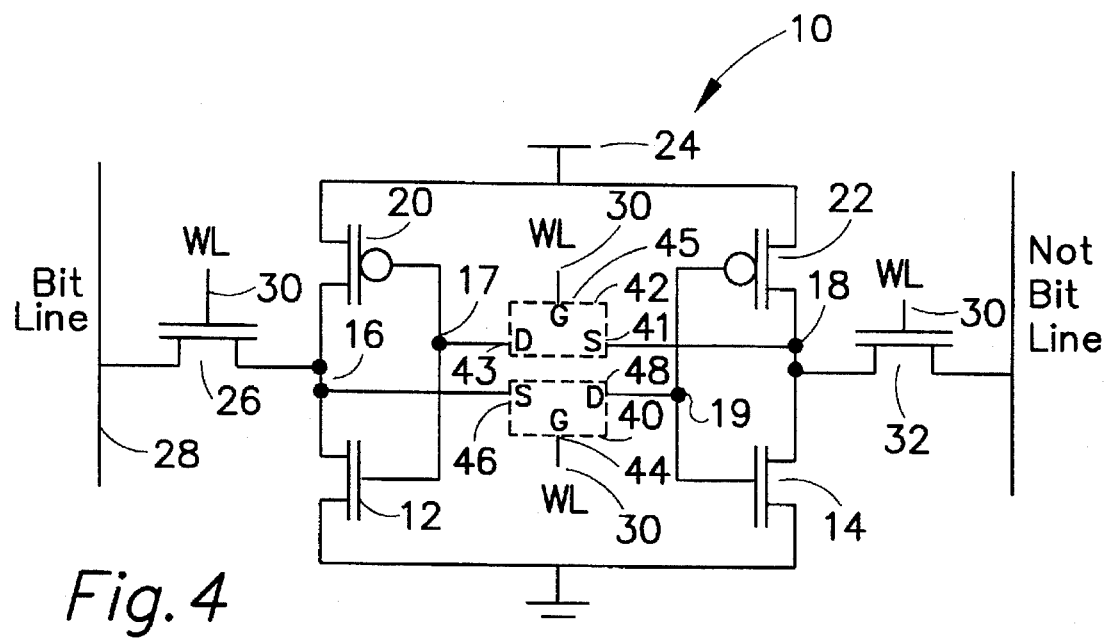
FIG. 4 is a schematic of an embodiment of the present invention.
Figure 7:
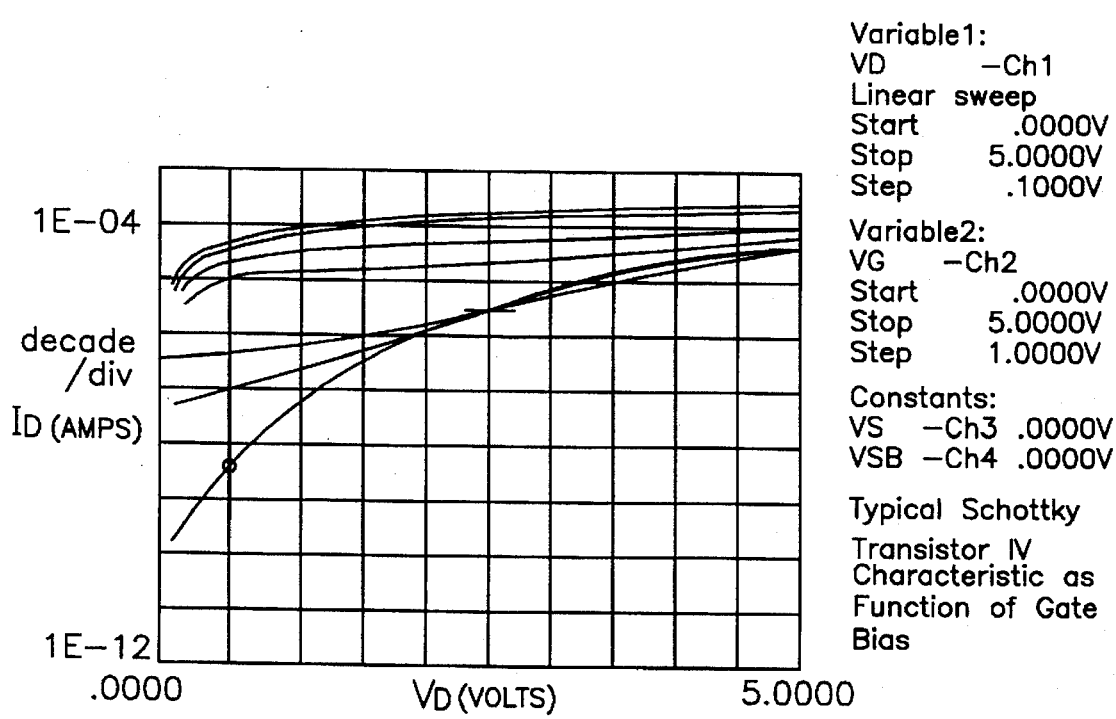
FIG. 7 is a graph of the current-voltage characteristic of the transistor of FIG. 6.

While any device which performs the above functions will be adequate, a resistive Schottky contact formed between the body and the source and drain, e.g., $TiSi_2$ on a boron doped P-type silicon turns out to be nearly ideal for this task. The characteristics of the Schottky device functions a) through d) are as follows. The forward bias voltage of a $TiSi_2$ schottky device is about 0.3 V which shorts out the 0.7 V forward voltage of the source (emitter) pn diode providing function (a). The reverse bias characteristic of the device is sufficiently resistive to perform function (b). Since the reverse bias characteristic is a function of the boron concentration it is easily optimized via boron implantation to minimize power up transients which experimentally have been determined to be the worst case condition of (c). With reference to FIG. 4, when the RAM is powered up, word line 30 is normally low and the resistance between node 16 and node 19 is high. A positive voltage at node 16 will gradually charge node 19. After some time, node 19 needs to be at a voltage that has transistor 22 completely turned off. Until it reaches this voltage, there is a DC current, i.e., crowbar current, present in the cell. That is node 19 is in the subthreshold leakage current region of transistor 22 and the mount of crowbar current is dependent on the voltage at node 19. An IV characteristic of the Schottky Transistor device is shown in FIG. 7. Finally, unlike MOS devices employing oxides to control the resistance, schottky contacts are immune to total dose radiation satisfying (d).

Fabrication of the composite device is accomplished by masking part of the source and drain regions from the Ldd and N+ implants used to create the standard n-channel transistors.

Figure 6:
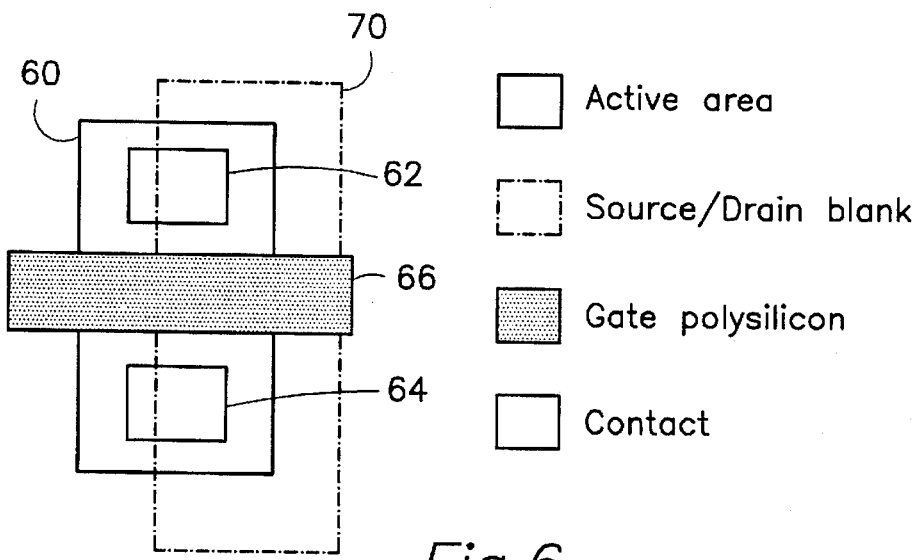
FIG. 6 is a top plan view of a transistor in accordance with the present invention.

A top view of transistor 40 is shown in FIG. 6 which shows a layout of a Schottky N-channel transistor in P-Well on SOI. The layout includes active area 60, source contact 62, drain contact 64 and gate polysilicon 66. Source/drain blank feature 70 blocks the normal N+ and $NL_{dd}$ implants from part of the device on both the source and drain sides. Typical P-well concentrations in the low $10^{17}/cm3$ create power up transients in the 100's of μsecs. Increasing the boron concentration via a blanket boron implant reduces these transients to the μsec region without causing any degradation of the more highly doped N+ and P+ to S/D regions of the rest of the transistors. The addition of a single boron implantation step to a standard SOI CMOS process is all that is required to optimize the device characteristic for power up transient behavior, while maintaining adequate resistance for SEU immunity. The optimal boron dose will depend on the layout geometry and specifics of the SRAM design but there is sufficient latitude to permit this device to be scaled into the deep submicron regime. The Schottky N-channel transistor shown as transistor 40 or 42 will also be effective in preventing single event upset when only a single transistor is used. For example, with reference to FIG. 4, assume that transistor 40 is not present and node 19 is connected to node 16. Also assume that node 16 is to be high. When an SEU event occurs in transistor 12, node 16 will be discharged to ground as will node 19. This will cause node 18 to go high. However, if transistor 42 provides sufficient resistance, it will require a first period of time for the high condition of 18 to propagate to node 17. During this first time, node 16 will be recharging and returning to its initial high state, then node 19 is high and node 18 is returned to its initial low state. Node 17 has remained low during the events just described.

This invention allows RAM devices to have much lower radiation induced upset rates than are currently possible without compromising the performance of the device.

We claim:

1. A CMOS memory cell, comprising:
   a first P-channel FET device connected between a first storage node and a relatively positive voltage and a first N channel FET device connected between said first storage node and a relatively negative voltage, with the gates of said first P channel and said first N channel devices connected in common at a first gate node and with said first storage node selectively connected to a first output line by a word line signal;
   a second P-channel FET device connected between a second storage node and said relatively positive voltage and a second N channel FET device connected between said second storage node and said relatively negative voltage, with the gates of said second P channel and said second N channel devices connected in common at a second gate node and with said second storage node selectively connected to a second output line by said word line signal; and
   at least a first coupling means having a first terminal connected to said word line signal, a second terminal connected to said first storage node, a third terminal connected to said second gate node, and a first body isolated from said relatively positive voltage and said relatively negative voltage, said first coupling means further having a first resistive means connected between said first coupling means second terminal and said first body, and a second resistive means connected between said first coupling means third terminal and said first body.

2. The CMOS memory cell of claim 1 wherein said first resistive means has a resistance value sufficiently low to maintain a first voltage value between said first coupling means second terminal and said first body below a value which would initiate a first lateral bipolar transistor action, and said second resistive means has a resistance value sufficiently high to prevent discharge of said second gate node following a discharge of said first storage node.

3. The CMOS memory cell of claim 1 wherein each of said first and second resistive means comprises a resistive Schottky device.

4. The CMOS memory cell of claim 3 wherein said resistive schottky device comprises a $TiSi_2$ Schottky device.

5. The CMOS memory cell of claim 2 wherein said first and second resistive means have a resistance value sufficiently low to allow said first gate node to charge up in a first time thereby limiting crowbar current.

6. The CMOS memory cell of claim 5 wherein said first and second resistive means are immune to total dose radiation.

7. The CMOS memory cell of claim 1 further comprising:
   a second coupling means having a first terminal connected to said word line signal, a second terminal connected to said second storage node, a third terminal connected to said first gate node, and a second body isolated from said relatively positive voltage and said relatively negative voltage, said second coupling means further having a third resistive means connected between said second coupling means second terminal and said second body, and a fourth resistive means connected between said second coupling means third terminal and said second body.

8. A CMOS memory cell comprising:

a first inverter having a first input and a first output, said first output selectively coupled to a first output line;

a second inverter having a second input and a second output, said second output connected to said first input and selectively coupled to a second output line; and a first transistor having a first terminal connected to a word line signal, a second terminal connected to said first output, a third terminal connected to said second input, and an isolated body, said first transistor having a first resistive means between said second terminal and said isolated body and a second resistive means between said third terminal and said isolated body.

9. The CMOS memory cell of claim 8 wherein said first resistive means has a resistance value sufficiently low to maintain a first voltage value between said second terminal and said isolated body below a value which would initiate a lateral bipolar transistor action and said second resistive means has a resistance value sufficiently high to prevent discharge of said second input following a discharge of said first output.

\* \* \* \* \*